(12) United States Patent
Li et al.

(10) Patent No.: US 8,421,186 B2
(45) Date of Patent: Apr. 16, 2013

(54) ELECTRICALLY PROGRAMMABLE METAL FUSE

(75) Inventors: Baozhen Li, South Burlington, VT (US); Chunyan E. Tian, Hopewell Junction, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 13/149,108

(22) Filed: May 31, 2011

(65) Prior Publication Data

US 2012/0306048 A1    Dec. 6, 2012

(51) Int. Cl.
*H01L 29/00*     (2006.01)
*H01L 23/525*    (2006.01)
*H01H 37/76*     (2006.01)

(52) U.S. Cl.
USPC ............ 257/529; 257/2; 257/3; 257/4; 257/5; 257/530; 257/758; 257/E21.529; 257/E23.149; 257/E23.15; 337/414; 438/131; 438/132; 438/601; 438/610

(58) Field of Classification Search ............ 257/2, 3, 257/4, 5, 530, 758, E21.529, E23.149, E23.15; 337/414; 438/131, 132, 601, 610
See application file for complete search history.

(56) References Cited

U.S. PATENT DOCUMENTS

| | | | |
|---|---|---|---|
| 6,375,159 B2 * | 4/2002 | Daubenspeck et al. | ........ 257/529 |
| 6,555,458 B1 | 4/2003 | Yu | |
| 6,870,751 B2 | 3/2005 | Van Brocklin et al. | |
| 7,541,676 B2 * | 6/2009 | Lee et al. | ...................... 257/758 |
| 7,572,682 B2 | 8/2009 | Yang et al. | |
| 7,777,926 B2 | 8/2010 | Une | |
| 2007/0007621 A1 | 1/2007 | Omura et al. | |
| 2008/0206978 A1 | 8/2008 | Hsu et al. | |
| 2010/0230780 A1 * | 9/2010 | Obayashi | ...................... 257/529 |
| 2011/0156858 A1 * | 6/2011 | Poppe et al. | ................... 337/414 |

OTHER PUBLICATIONS

IBM, "Electrical Fuse with Ru Liner" IP.com PriorArtDatabase, IPCOM000185169D (Jul. 14, 2009).

* cited by examiner

*Primary Examiner* — Dao H Nguyen
(74) *Attorney, Agent, or Firm* — Scully, Scott, Murphy & Presser, P.C.; Wenjie Li (57) ABSTRACT

A metal electrically programmable fuse ("eFuse") includes a metal strip, having a strip width, of a metal line adjoined to wide metal line portions, having widths greater than the metal strip width, at both ends of the metal strip. The strip width can be a lithographic minimum dimension, and the ratio of the length of the metal strip to the strip width is greater than 5 to localize heating around the center of the metal strip during programming. Localization of heating reduces required power for programming the metal eFuse. Further, a gradual temperature gradient is formed during the programming within a portion of the metal strip that is longer than the Blech length so that electromigration of metal gradually occurs reliably at the center portion of the metal strip. Metal line portions are provides at the same level as the metal eFuse to physically block debris generated during programming.

20 Claims, 11 Drawing Sheets

ELECTRICALLY PROGRAMMABLE METAL FUSE

BACKGROUND

The present disclosure relates to semiconductor structures and particularly to metal electrical fuses that can be formed in a back-end-of-line (BEOL) interconnect structures and methods of programming the same.

Electrical fuses and electrical antifuses are used in the semiconductor industry to implement array redundancy, field programmable arrays, analog component trimming circuits, and chip identification circuits. Once programmed, the programmed state of an electrical fuse or an electrical antifuse does not revert to the original state on its own, that is, the programmed state of the fuse is not reversible. For this reason, electrical fuses and electrical antifuses are called One-Time-Programmable (OTP) memory elements.

Figure 1:
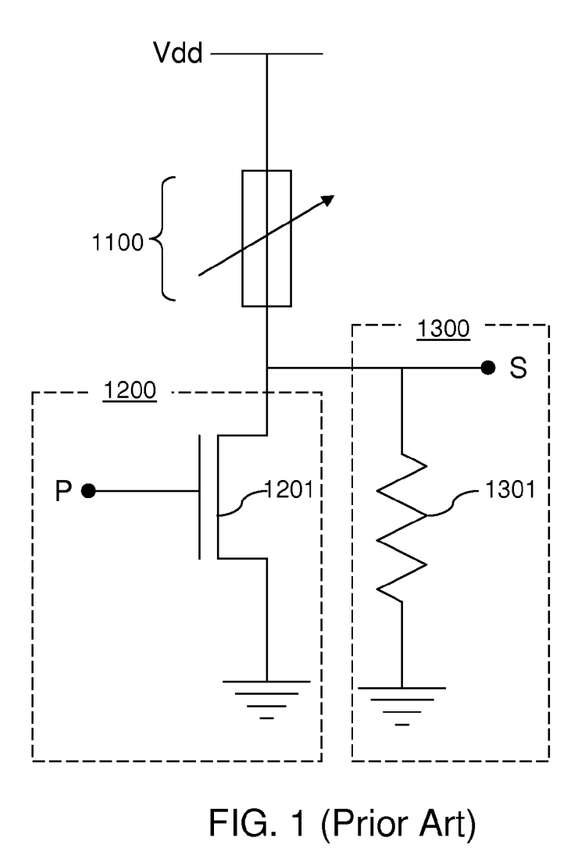
FIG. 1 is a circuit schematic for an electrically programmable fuse (eFuse) programming and sensing circuit.

FIG. 1 illustrates a circuit schematic of a circuitry including an electrically programmable fuse ("eFuse") 1100. The electrically programmable fuse 1100 and a programming circuit 1200 are connected in a series connection between a power supply node Vdd and electrical ground. The programming circuit 1200 includes a switch, which can be implemented in the form of at least one transistor 1201 configured to switch on or off the electrical current through the electrically programmable fuse 1100. When a programming signal is applied to a programming node P, which can be the gate of a programming transistor 1201, electrical current passes through, and programs, the electrically programmable fuse 1100. An unprogrammed electrically programmable fuse has a low resistance, which is typically less than 100 Ohms, and a programmed electrically programmable fuse has a high resistance, which is typically greater than 1 kOhms. A sensing circuit 1300 attached to a node between the electrically programmable fuse 1100 and the programming circuit 1200 is configured to indicate the state of the electrically programmable fuse 1100 at the sense node S. The sensing circuit 1300 can include, for example, a sensing resistor 1301 connected in a parallel connection with the programming circuit 1200 relative to the electrically programmable fuse 1100. When the switch is turned off in the programming circuit 1200, for example, by turning off the programming transistor, the electrically programmable fuse 1100 and the sensing resistor 1301 can function as a voltage divider, thereby providing a voltage output at the sensing node S that depends on the state of the electrically programmable fuse 1100. Various sensing circuits 1300 are known in the art.

A metal electrically programmable fuse is formed in back-end-of-line (BEOL) interconnect structures, and thus, requires much less device area than a metal-silicide-based electrically programmable fuse. Challenges for metal eFuses include reliable programming yield and reproducibility. Ideally, programming of a metal eFuse should form a void in a metal line through electromigration of metal without causing damage to a liner or a dielectric cap or surrounding interlevel dielectric materials. However, controlling electromigration in a metal line has been very difficult, and programming of prior art metal fuses has produced a combination of voiding and fusing between metal line and a metallic liner, or an uncontrolled blow. If the programming power is too low, a void in a programmed metal fuse can be too small, and there is a possibility of "healing" of a programmed metal eFuse during product operation through metal electromigration, which can render a programmed fuse to be sensed as an unprogrammed fuse. If the programming power is too high, collateral structural damage to surrounding structures can be too extensive; impact to reliability of neighboring metal lines and introducing reliability concerns. In practice, due to structure to structure, chip to chip, wafer to wafer, and lot to lot variations in the physical structures for metal eFuses, the programming power window for prior art metal eFuses can be very small.

BRIEF SUMMARY

A metal electrically programmable fuse ("eFuse") includes a metal strip, having a strip width, of a metal line adjoined to wide metal line portions, having widths greater than the strip width, at both ends of the metal strip. The strip width can be a lithographic minimum dimension, and the ratio of the length of the metal strip to the strip width is greater than 5 to localize heating around the center of the metal strip during programming. Localization of heating reduces required power for programming the metal eFuse. Further, a gradual temperature gradient is formed within a length that is longer than the Blech length during the programming within the metal strip so that electromigration of metal gradually occurs reliably at the center portion of the metal strip. Metal line portions are provided at the same level as the metal eFuse to physically block debris generated during programming, and to prevent metallic materials from the programmed fuse from diffusing outside of the space defined by these "blocking lines" during product operation. Further, additional metal lines and/or metal vias can be placed at different wiring levels 1) to prevent debris from escaping the area of the metal eFuse; 2) to prevent thermal cracking from propagating outside the area of the eFuse during programming; and 3) to prevent metal from diffusing out of the eFuse region during the product operation.

According to an aspect of the present disclosure, a structure including an electrically programmable fuse (eFuse) is provided. The eFuse includes an integral assembly of metal strip, a first metal line portion, and a second metal line portion without an interface thereamongst, wherein the integral assembly is embedded in a wiring level dielectric material layer, a first end of the metal strip is adjoined to the first metal line portion, a second end of the metal strip is adjoined to the second metal line portion, the first metal line portion and the second metal line portion have widths that are greater than a strip width of the metal strip, and the first metal line portion and the second metal line portion collectively block all line-of-sight horizontal directions from an entirety of sidewalls of the strip portion.

According to another aspect of the present disclosure, a method of programming an electrically programmable fuse (eFuse) is provided. The method includes: forming an eFuse and a programming transistor conductive connected to the eFuse on a semiconductor substrate and turning on the programming transistor during programming of the eFuse. The eFuse includes an integral assembly of metal strip, a first metal line portion, and a second metal line portion without an interface thereamongst. The integral assembly is embedded in a wiring level dielectric material layer, a first end of the metal strip is adjoined to the first metal line portion, a second end of the metal strip is adjoined to the second metal line portion, the first metal line portion and the second metal line portion have widths that are greater than a strip width of the metal strip, and the first metal line portion and the second metal line portion collectively block all line-of-sight horizontal directions from an entirety of sidewalls of the strip portion. Electrical current passes through the programming transistor and the eFuse to cause electromigration of metal at a center portion of the eFuse and to form a void therein.

BRIEF DESCRIPTION OF THE SEVERAL VIEWS OF THE DRAWINGS

FIGS. 3A-3C are horizontal cross-sectional views of the first exemplary eFuse structure according to the first embodiment of the present disclosure. In FIGS. 3B and 3C, areas of the structures in the eFuse level metal wiring layer are overlaid in dotted lines in order to illustrate the spatial relationship between various elements.

FIGS. 4A-4C are horizontal cross-sectional views of a variation of the first exemplary eFuse structure according to the first embodiment of the present disclosure. In FIGS. 4B and 4C, areas of the structures in the eFuse level metal wiring layer are overlaid in dotted lines in order to illustrate the spatial relationship between various elements.

FIGS. 6A-6E are horizontal cross-sectional views of the second exemplary eFuse structure according to the second embodiment of the present disclosure. In FIGS. 6B-6E, areas of the structures in the eFuse level metal wiring layer are overlaid in dotted lines in order to illustrate the spatial relationship between various elements.

FIGS. 7A-7E are horizontal cross-sectional views of a variation of the second exemplary eFuse structure according to the second embodiment of the present disclosure. In FIGS. 7B-7E, areas of the structures in the eFuse level metal wiring layer are overlaid in dotted lines in order to illustrate the spatial relationship between various elements.

DETAILED DESCRIPTION

As stated above, the present disclosure relates to metal electrical fuses that can be formed in a back-end-of-line (BEOL) interconnect structures and methods of programming the same, which are now described in detail with accompanying figures. It is noted that like and corresponding elements mentioned herein and illustrated in the drawings are referred to by like reference numerals.

Referring to FIG. 2 and FIGS. 3A-3C, a first exemplary eFuse structure according to a first embodiment of the present disclosure includes a stack, from bottom to top, of a semiconductor substrate 8, underlying interconnect structure layers 15, electrically programmable fuse-including ("e-Fuse-including") interconnect structure layers 55, and overlying interconnect structure layers 95. The semiconductor substrate 8 includes a semiconductor material layer, and may be a bulk semiconductor substrate or a semiconductor-on-insulator (SOI) substrate. A programming transistor 201 for programming an electrically programmable fuse 100 can be provided on the semiconductor substrate 8. Further, additional semiconductor devices 205 such as field effect transistors, junction transistors, diodes, capacitors, inductors, resistors, and/or optical communication devices as known in the art can also be formed on the semiconductor substrate 8.

Figure 2:
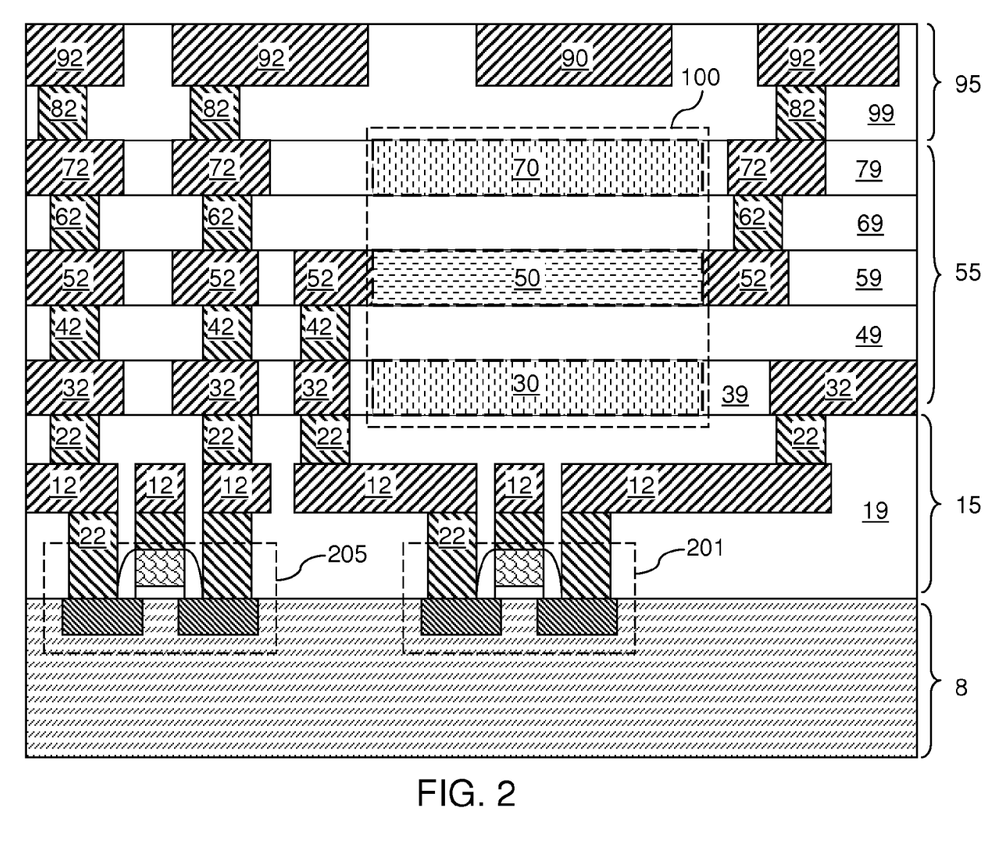
FIG. 2 is a vertical cross-sectional view of a first exemplary eFuse structure according to a first embodiment of the present disclosure. At least one lower level metal plate 30, an integrated assembly 50, and at least one upper level metal plate 70 are schematically depicted (without detailing the cross-sectional area of an actual structure) in FIG. 2.

The underlying interconnect level layer 15 includes at least one underlying dielectric material layer 19 and metal interconnect structures embedded therein, which are herein referred to as underlying level metal interconnect structures. The at least one underlying dielectric material layer 19 includes a dielectric material such as silicon oxide, silicon nitride, organosilicate glass, or other dielectric material that can be employed as a dielectric material in an interconnect level. The underlying level metal interconnect structures includes at least one underlying interconnect metal via 22, and may include at least one underlying interconnect metal line 12.

The eFuse-including interconnect structure layers 55 can include a stack, from bottom to top, of an lower level metal wiring layer, an lower level metal via layer, an eFuse level metal wiring layer, an upper level metal via layer, and an upper level metal wiring layer. A lower wiring level dielectric material layer 39, at least one lower level metal plate 30, and lower level metal lines 32 fill the lower level metal wiring layer (30, 32, 39). A lower via level dielectric material layer 49 and lower level metal vias 42 complimentarily fill the lower level metal via layer (42, 49). An eFuse level dielectric material layer 59, an integral assembly 50 of eFuse components, and eFuse level metal lines 52 fill the eFuse level metal wiring layer (50, 52, 59). An upper via level dielectric material layer 69 and upper level metal vias 62 complimentarily fill the upper level metal via layer (62, 69). An upper wiring level dielectric material layer 79, at least one upper level metal plate 70, and upper level metal lines 72 fill the upper level metal wiring layer (30, 32, 39). Any dielectric material for metal interconnect structures as known in the art can be employed for each of the lower wiring level dielectric material layer 39, the lower via level dielectric material layer 49, the eFuse level dielectric material layer 59, the upper via level dielectric material layer 69, and the upper wiring level dielectric material layer 79.

The overlying interconnect structure layers 95 can include at least one overlying dielectric material layer 99 and metal interconnect structures embedded therein, which are herein referred to as upper level metal interconnect structures. The at least one overlying dielectric material layer 99 includes a dielectric material such as silicon oxide, silicon nitride, organosilicate glass, or other dielectric material that can be employed as a dielectric material in an interconnect level. The overlying level metal interconnect structures includes overlying interconnect metal vias 82 and overlying interconnect metal lines 92. Metal wiring structures embedded in the various dielectric material layers (19, 39, 49, 59, 69, 79, 99) can be conductively connected to the additional semiconductor devices 205.

Figure 3A:
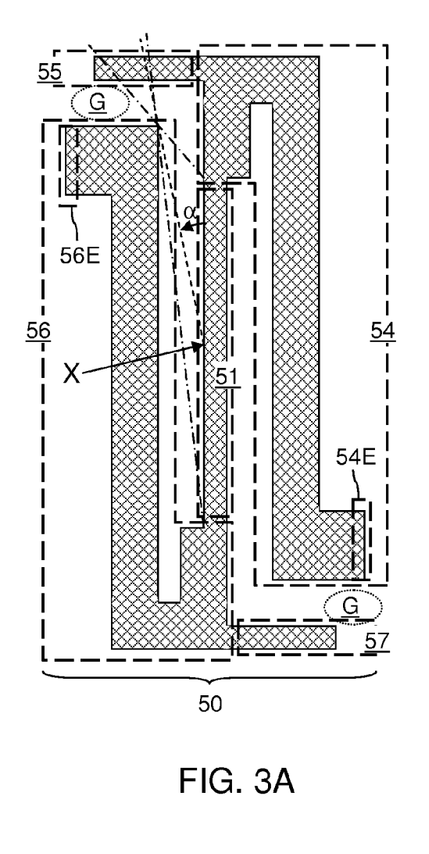
FIG. 3A is a horizontal cross-sectional view at an eFuse level metal wiring layer.

The integral assembly 50 is located within the eFuse level metal wiring layer (50, 52, 59), and is embedded in the Fuse level dielectric material layer 59, which is a wiring level dielectric material layer, i.e., a dielectric material layer in which metal lines providing horizontal electrical connection among elements are embedded. The integral assembly 50 includes a metal strip 51, a first metal line portion 54, and a second metal line portion 56. The entirety of the integral assembly 50 is formed as a contiguous metal structure by a single damascene method, a dual damascene method, or a blanket metal deposition and lithographic patterning. Thus, there is no physically observable interface between the metal strip 51 and the first metal line portion 54 or between the metal strip 51 and the second metal line portion 56. A first end of the metal strip 51 is adjoined to the first metal line portion 54, and a second end of the metal strip 51 is adjoined to the second metal line portion 56.

The metal strip 51 includes a rectangular parallelepiped having a constant width, which is herein referred to as a strip width 52. It is understood that the sidewalls of the metal strip 51 may have a non-zero taper angle that may be introduced during manufacturing, and the term "rectangular parallelepiped" includes shapes for such process-induced variations on an ideal rectangular parallelepiped as well. The rectangular parallelepiped within the metal strip 51 extends between the first metal line portion 52 and the second metal line portion 54, i.e., from an end of the first metal line portion 52 to an end of the second metal line portion 54.

The first metal line portion 54 and the second metal line portion have widths that are greater than the strip width ws of the metal strip 51. Specifically, the first metal line portion 54 can have a first width w1 at a region that laterally contact the metal strip 51, and the second metal line portion 54 can have a second width w2 at a region that laterally contact the metal strip 51. The first width w1 and the second width w2 are greater than the strip width ws so that the current density during programming of the eFuse is greater within the metal strip 51 than in the first metal line portion 54 or the second metal line portion 56. By configuring the metal strip 51 narrower than the first metal line portion 54 or the second metal line portion 56, while having the same thickness, the metal strip 51 heats up to a higher temperature during programming than the first metal line portion 54 or the second metal line portion 56.

In one embodiment, the strip width ws can be the smallest dimension that can be printed, i.e., a "minimum printable dimension" in the eFuse level metal wiring layer (50, 52, 59) for the lithographic tool employed to pattern the various metal structures therein. For state-of-the-art lithographic tools available in 2011, such a minimum printable dimension is about 45 nm.

The first metal line portion 54 and the second metal line portion 56 are shaped to be able to block all debris that may originate from any portion of the metal strip 51 and ejected in any horizontal direction during programming of the eFuse. For example, the first metal line portion 54 can include a first protrusion 58 that extends around sidewalls of the second metal line portion 56 that is not parallel to sidewalls of the metal strip 51. The first protrusion 58 laterally extends outward to a sufficient distance so that any projectile from the metal strip 51 that is ejected from the metal strip 51 and travelling in a horizontal direction is stopped by the second metal line portion 56 or the first protrusion 58. The projectile can be any fragment of the metal strip 51 that travels in a linear direction from any point X on the left side sidewall of the metal strip at an angle α relative to the sidewall of the metal strip. Similarly, the second metal line portion 56 can include a second protrusion 57 that extends around sidewalls of the first metal line portion 54 that is not parallel to sidewalls of the metal strip 51. The second protrusion 57 laterally extends outward to a sufficient distance so that any projectile from the metal strip 51 that is ejected from the metal strip 51 and travelling in a horizontal direction is stopped by the first metal line portion 54 or the second protrusion 57. Thus, the first metal line portion 54, which includes the first protrusion 58, and the second metal line portion 56, which includes the second protrusion 57, collectively block all line-of-sight horizontal directions from an entirety of sidewalls of the strip portion 52.

The aspect ratio of the metal strip 51, i.e., the ratio of the length of the metal strip 51 to the strip width ws, is selected to enable localized heating of the metal strip 51 at the center thereof during the programming. The greater the aspect ratio, the greater the localization of heating of the metal strip 51 during programming. In one embodiment, the rectangular parallelepiped of the metal strip 51 has an aspect ratio greater than 5.0, i.e., has a length that is at least five times the strip width.

The aspect ratio of the metal strip 51 can also be determined to avoid Blech effect. Blech effect refers to a phenomenon in which electromigration does not occur within a metal interconnect structure if the length of the metal interconnect structure is less than a minimum length. The minimum length is determined based on the material employed for the metal interconnect structure, as well as the width and the thickness, i.e., height, of the metal interconnect structure. The mechanism for Blech effect is the build up of mechanical stress within the metal interconnect structure providing force toward the cathode to compensate the electromigrative force for material flow towards the anode. By increasing the aspect ratio of the metal strip 51, the metal strip 51 has a shape that can be electromigrated during programming. In one embodiment, the length of the metal strip 51 is set at a length that exceeds three times the Blech length to promote electromigration within the metal strip 51 during programming of the eFuse 100.

Figure 3B:
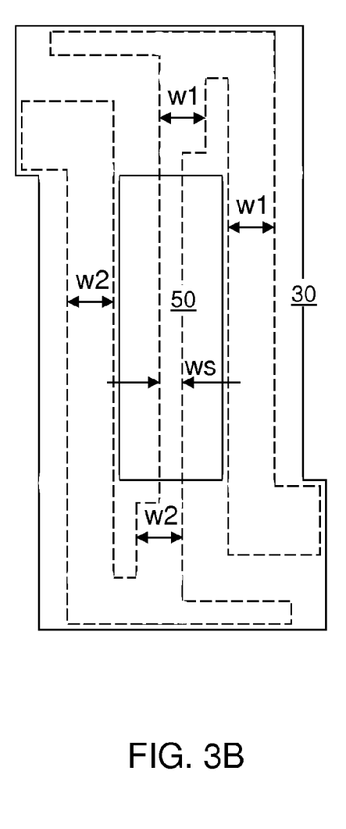
FIG. 3B is a horizontal cross-sectional view at an underlying metal wiring layer.
Figure 3C:
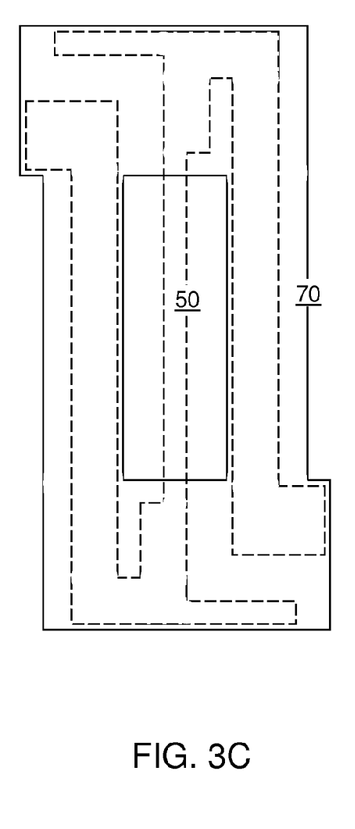
FIG. 3C is a horizontal cross-sectional view of an overlying metal wiring layer.

An upper level metal plate 70 is embedded in the upper wiring level dielectric material layer 79. The upper wiring level dielectric material layer 79 is located above the eFuse level dielectric material layer 59, which is a wiring level dielectric material layer. The upper level metal plate 70 overlies at least a portion of the integral assembly 50. In one embodiment, the upper level metal plate 70 can overlie all of the first metal line portion 54 and the second metal line portion 56. The upper level metal plate 70 can be of integral construction. In one embodiment, the upper level metal plate 70 is electrically isolated from the integral assembly 50. In another embodiment, the upper level metal plate 70 can be electrically connected to one of the first metal line portion 54 and the second metal line portion 56 such that the electrical connection path does not pass through the metal strip 50, and electrically connected through the other of the first metal line portion 54 and the second metal line portion 56 such that the electrical connection path passes through the metal strip 50. The upper level metal plate 70 can have an opening therein so that the upper level metal plate 70 does not overlie a center portion of the metal strip 50.

A lower level metal plate 30 is embedded in the lower wiring level dielectric material layer 39. The lower wiring level dielectric material layer 39 is located below the eFuse level dielectric material layer 59. The lower level metal plate 30 underlies at least a portion of the integral assembly 50. In one embodiment, the lower level metal plate 30 can underlie all of the first metal line portion 54 and the second metal line portion 56. The lower level metal plate 30 can be of integral construction. In one embodiment, the lower level metal plate 30 is electrically isolated from the integral assembly 50. In another embodiment, the lower level metal plate 30 can be electrically connected to one of the first metal line portion 54 and the second metal line portion 56 such that the electrical connection path does not pass through the metal strip 50, and electrically connected through the other of the first metal line portion 54 and the second metal line portion 56 such that the electrical connection path passes through the metal strip 50. The lower level metal plate 30 can have an opening therein so that the lower level metal plate 30 does not underlie a center portion of the metal strip 50.

In one embodiment, both the upper level metal plate 70 and the at least one lower level metal plate 30 can be electrically isolated from the integral assembly 50.

The eFuse 100 and the eFuse-including interconnect structure layers 55, including the eFuse level dielectric material layer 59 that is a wiring level dielectric material layer, are located on the semiconductor substrate 8. The programming transistor 201 is located on the semiconductor substrate 8, and is conductively connected to one of the first metal line portion 54 and the second metal line portion 56 through a set of metal interconnect structures including at least one conductive metal via, such as underlying interconnect metal vias 22 and lower level metal vias 42.

The eFuse 100 can be programmed by turning on the programming transistor 201. During programming of the eFuse 100, electrical current passes through the programming transistor 201 and the eFuse 100 to cause electromigration of metal at a center portion of the eFuse, i.e., at a center portion of the metal strip 51, and to form a void therein.

Specifically, the electrical current passes through the programming transistor 201, a first set of metal interconnect structures including at least a first metal via (e.g., the lower level metal via 42 vertically contacting the eFuse level metal line 52 that contacts the left side of the integrated assembly 50 in FIG. 2), a first metal line structure (e.g., the eFuse level metal line 52 that contacts the left side of the integrated assembly 50 in FIG. 2) embedded in the eFuse level dielectric material layer 59 (which is a wiring level dielectric material layer) and laterally contacting the first metal line portion 54 and vertically contacting the first metal via, the integral assembly 50, a second metal line structure (e.g., the eFuse level metal line 52 that contacts the right side of the integrated assembly 50 in FIG. 2) embedded in the eFuse level dielectric material layer 59 and laterally contacting the second metal line portion, and a second set of metal interconnect structures including a second metal via (e.g., an upper level metal via 62 vertically contacting the eFuse level metal line 52 that contacts the right side of the integrated assembly 50 in FIG. 2) vertically contacting the second metal line structure.

Typically, the first metal line structure and the second metal line structure can be formed in the same processing steps by depositing a metal layer in trenches and planarizing the metal layer. Thus, first metal line structure and the second metal line structure can be of integral construction with the integral assembly 50, i.e., formed as a single piece without any physically manifested interface thereamongst.

During the programming of the eFuse 100, a temperature gradient is formed within and around the metal strip 51. A center portion of the metal strip 51 is heated to a temperature higher than any other location within the eFuse 100. The temperature gradient is formed along the lengthwise direction of the metal strip 51, i.e., in a direction along the horizontal direction within the sidewalls of the metal strip 51.

The high aspect ratio of the metal strip 51, i.e., the aspect ratio that exceeds 5.0, provides a gradual temp gradient within the metal strip during the programming. Thus, the programming of the eFuse 100 proceeds in an electromigration-dominated mode instead of a blowout mode, thereby minimizing the debris that fly out from the metal strip 51 during programming. Further, use of electromigration during programming tends to increase the size of the void formed by programming and increases the minimum distance between residual conductive materials within the void. Thus, post-programming resistance of programmed eFuses can be reproducibly and reliably higher in the electromigration-dominated mode than in the blowout mode.

The metal strip 51 and the first and second metal line portions (54, 56) are configured to block all debris from the metal strip 51 in all horizontal directions. Thus, the material of the metal strip 51, which can be copper, is confined within a local area after programming even if debris fly out horizontally. The local area is defined by inner sidewalls of the first and second metal line portions (54, 56), which include the inner sidewalls of the first and second protrusions (58, 57). The metallic material of the metal strip 51 is prevented from mechanically flying out by the first and second metal line portions (54, 56).

Further, due to the lateral confinement of the heat by the first and second metal line portions (54, 56), any cracking in the eFuse level dielectric material layer 59 is limited within the area enclosed by sidewalls of the first and second metal line portions (54, 56) and the narrow gap regions G between the first and second metal line portions (54, 56) that are shielded from all line-of-sight directions from the metal strip 51 by inner portions of the first and second metal line portions (54, 56). Thus, the geometry of the first and second metal line portions (54, 56) provides an inherent built-in protection against diffusion of metallic material originating from the metal strip 51. In other words, the metallic material of the metal strip 51 is prevented from laterally diffusing out by the first and second metal line portions (54, 56).

The upper level metal plate 70 and the lower level metal plate 30 help confine the heat generated during the programming within the vertical levels of the lower via level dielectric material layer 49, the eFuse level dielectric material layer 59, and the upper via level dielectric material layer 69. Further, the upper level metal plate 70 and the lower level metal plate 30 help prevent debris from the metal strip 51 generated during the programming from traveling outside the eFuse 100. In addition, the upper level metal plate 70 and the lower level metal plate 30 reduce diffusion of metal from the metal strip 51 after programming.

Figure 4A:
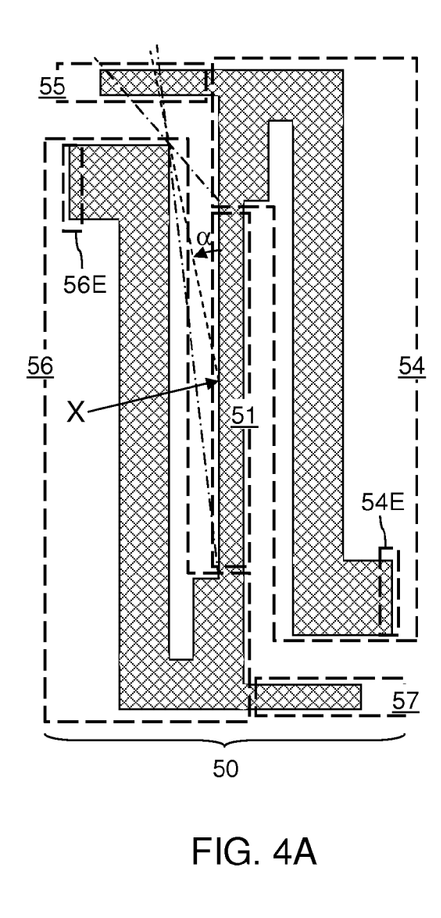
FIG. 4A is a horizontal cross-sectional view at an eFuse level metal wiring layer.
Figure 4B:
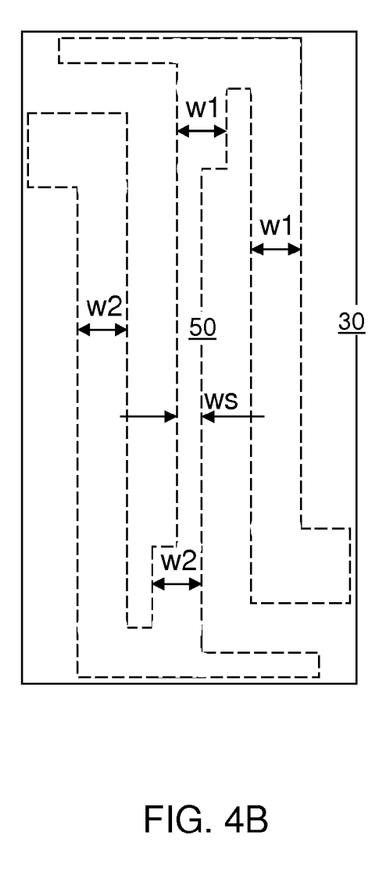
FIG. 4B is a horizontal cross-sectional view at an underlying metal wiring layer.
Figure 4C:
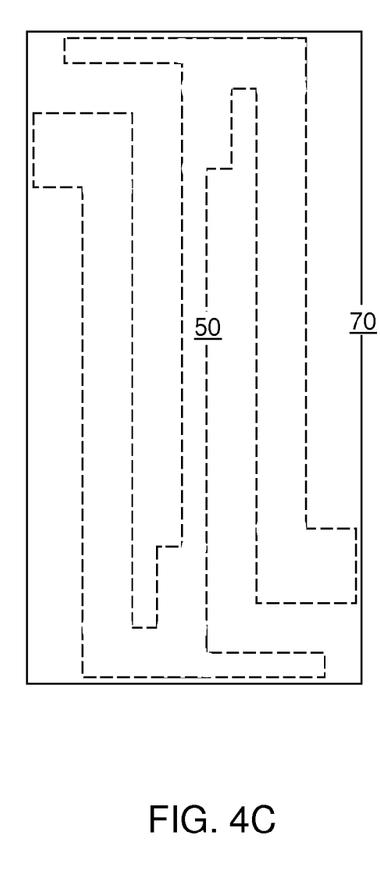
FIG. 4C is a horizontal cross-sectional view of an overlying metal wiring layer.

Referring to FIGS. 4A-4C, a variation of the first exemplary eFuse structure according to the first embodiment of the present disclosure can be derived from the first exemplary eFuse structure of FIGS. 2 and 3A-3C by modifying the upper level metal plate 70 and/or the lower level metal plate 30.

The upper level metal plate 70 is embedded in the upper wiring level dielectric material layer 79. The upper level metal plate 70 can overlie the entirety of the metal strip 51. In one embodiment, the upper level metal plate 70 can overlie the entirety of the integrated assembly 50. The upper level metal plate 70 can be of integral construction. In one embodiment, the upper level metal plate 70 is electrically isolated from the integral assembly 50. In another embodiment, the upper level metal plate 70 can be electrically connected to one of the first metal line portion 54 and the second metal line portion 56 such that the electrical connection path does not pass through the metal strip 50, and electrically connected through the other of the first metal line portion 54 and the second metal line portion 56 such that the electrical connection path passes through the metal strip 50.

The lower level metal plate 30 is embedded in the lower wiring level dielectric material layer 39. The lower level metal plate 30 can underlie the entirety of the metal strip 51. In one embodiment, the lower level metal plate 30 can underlie the entirety of the integrated assembly 50. The lower level metal place 30 can be of integral construction. In one embodiment, the lower level metal plate 30 is electrically isolated from the integral assembly 50. In another embodiment, the lower level metal plate 30 can be electrically connected to one of the first metal line portion 54 and the second metal line portion 56 such that the electrical connection path does not pass through the metal strip 50, and electrically connected through the other of the first metal line portion 54 and the second metal line portion 56 such that the electrical connection path passes through the metal strip 50.

In one embodiment, both the upper level metal plate 70 and the at least one lower level metal plate 30 can be electrically isolated from the integral assembly 50.

The upper level metal plate 70 and the lower level metal plate 30 confine the heat generated during the programming within the vertical levels of the lower via level dielectric material layer 49, the eFuse level dielectric material layer 59, and the upper via level dielectric material layer 69. Further, the upper level metal plate 70 and the lower level metal plate 30 prevent debris from the metal strip 51 generated during the programming from traveling outside the eFuse 100. In addition, the upper level metal plate 70 and the lower level metal plate 30 reduce diffusion of metal from the metal strip 51 after programming.

Referring to FIG. 5 and FIGS. 6A-6E, a second exemplary eFuse structure according to the second embodiment of the present disclosure can be formed in the same manner as in the first embodiment. In the second exemplary eFuse structure, electrical connection to the first metal line portion 54 and/or electrical connection to the second metal line portion 56 can be provided by at least one metal via vertically contacting the first metal line portion 54 or the second metal line portion 56 instead of a metal line embedded in the eFuse level dielectric material layer 59.

Figure 5:
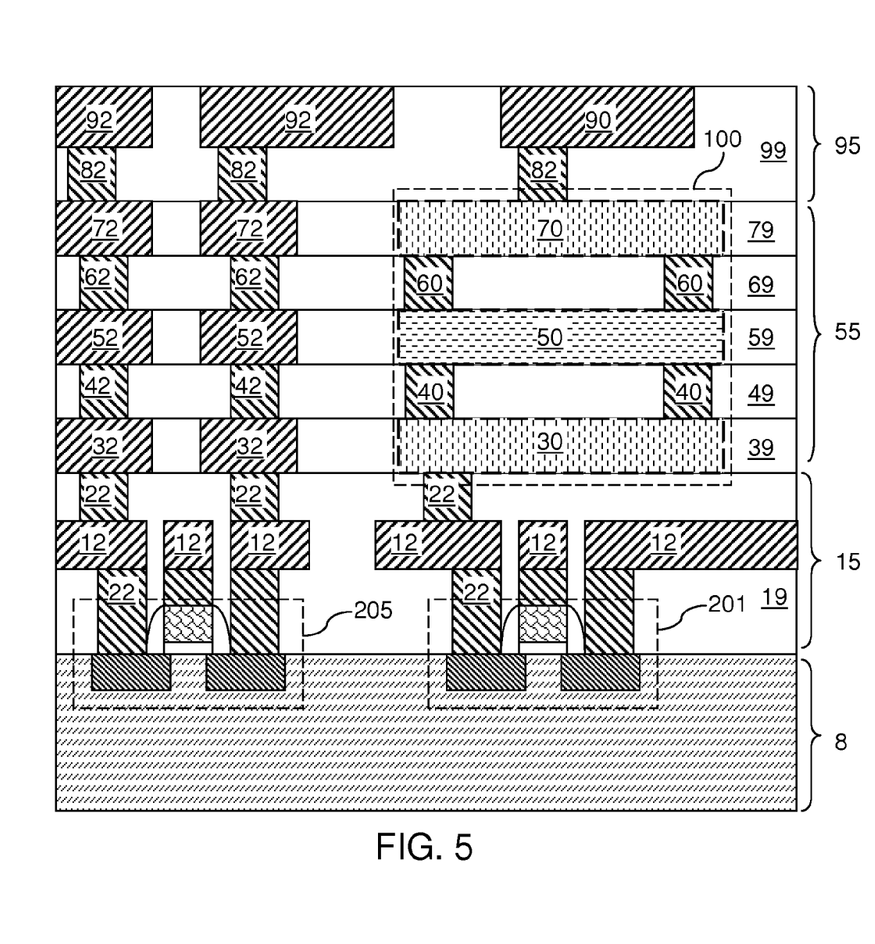
FIG. 5 is a vertical cross-sectional view of a second exemplary eFuse structure according to a second embodiment of the present disclosure. At least one lower level metal plate 30, an integrated assembly 50, and at least one upper level metal plate 70 are schematically depicted (without detailing the cross-sectional area of an actual structure) in FIG. 5.
Figure 6A:
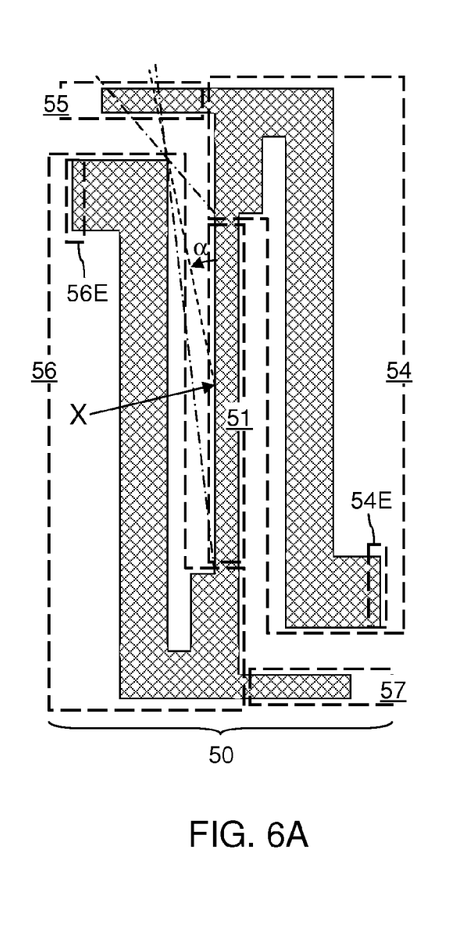
FIG. 6A is a horizontal cross-sectional view at an eFuse level metal wiring layer.
Figure 6B:
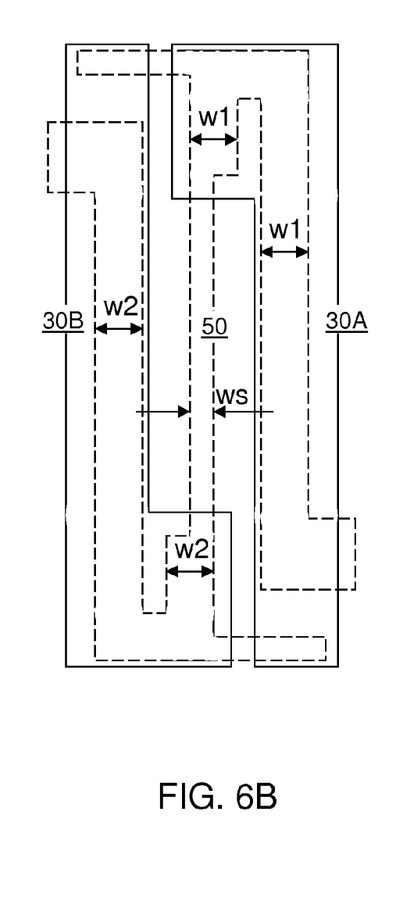
FIG. 6B is a horizontal cross-sectional view at an underlying metal wiring layer.
Figure 6C:
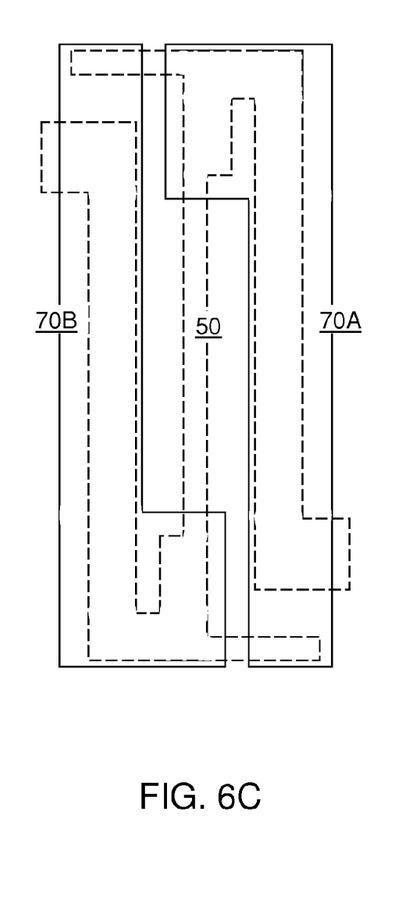
FIG. 6C is a horizontal cross-sectional view of an overlying metal wiring layer.

A pair of upper level metal plates (70A, 70B) can be embedded in the upper wiring level dielectric material layer 79. The upper wiring level dielectric material layer 79 is located above the eFuse level dielectric material layer 59, which is the wiring level dielectric material layer embedding the integrated assembly 50. The pair of upper level metal plates (70A, 70B) overlies at least a portion of the integral assembly 50. A pair of lower level metal plates (30A, 30B) can be embedded in the lower wiring level dielectric material layer 39, which is located below the eFuse level dielectric material layer 59. The pair of lower level metal plates (30A, 30B) underlies at least a portion of the integral assembly 50.

Specifically, a first upper level metal plate 70A overlies the first metal line portion 52, and a second upper level metal plate 70B overlies the second metal line portion 54. A first lower level metal plate 30A underlies the first metal line portion 52, and a second lower level metal plate 30B underlies the second metal line portion 54.

Figure 6D:
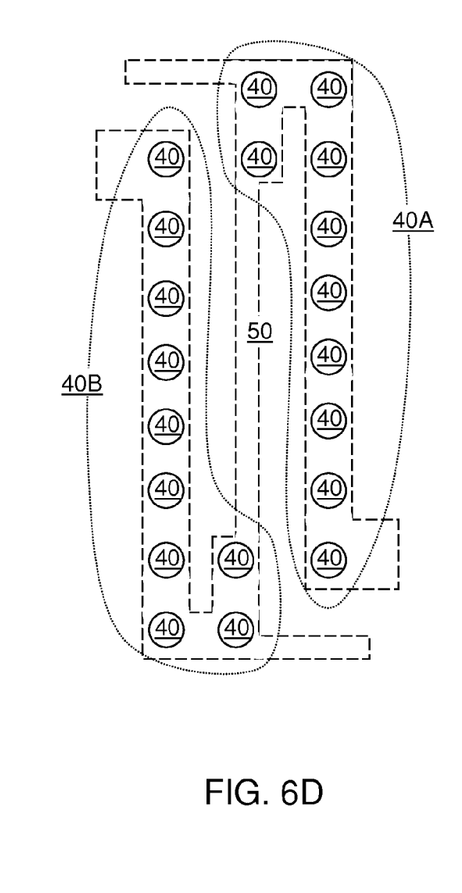
FIG. 6D is a horizontal cross-sectional view of an underlying via level layer.
Figure 6E:
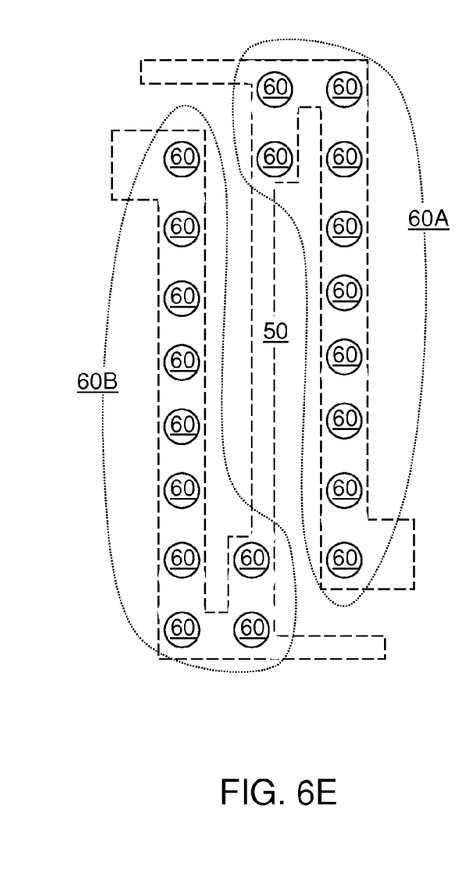
FIG. 6E is a horizontal cross-sectional view of an overlying via level layer.
Figure 7A:
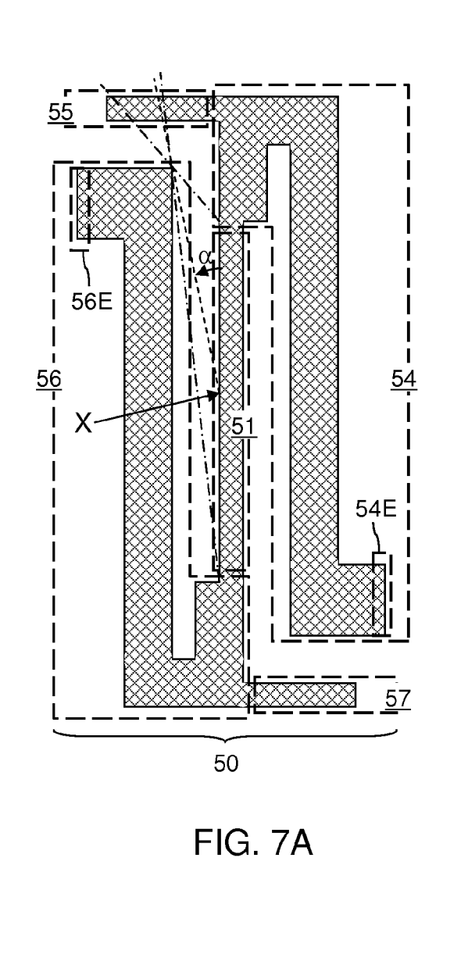
FIG. 7A is a horizontal cross-sectional view at an eFuse level metal wiring layer.
Figure 7B:
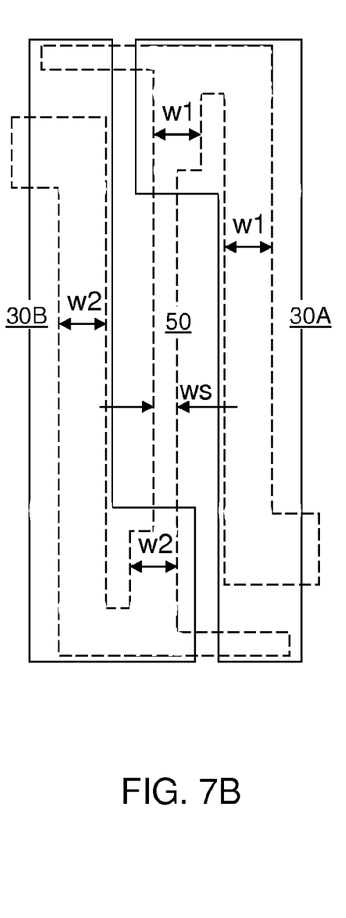
FIG. 7B is a horizontal cross-sectional view at an underlying metal wiring layer.
Figure 7C:
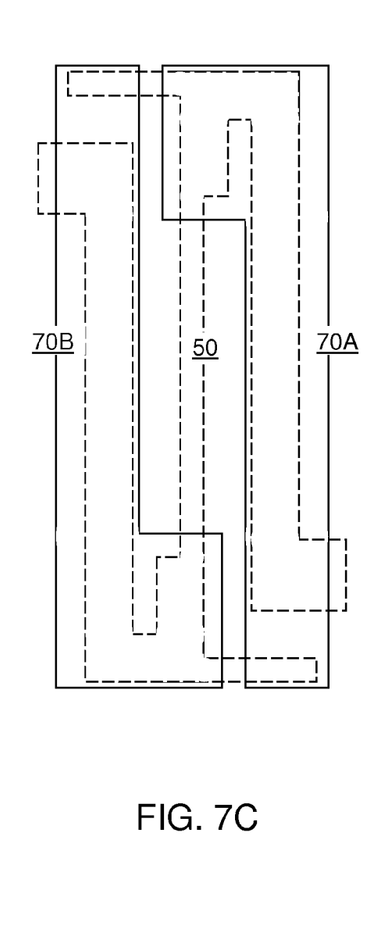
FIG. 7C is a horizontal cross-sectional view of an overlying metal wiring layer.
Figure 7D:
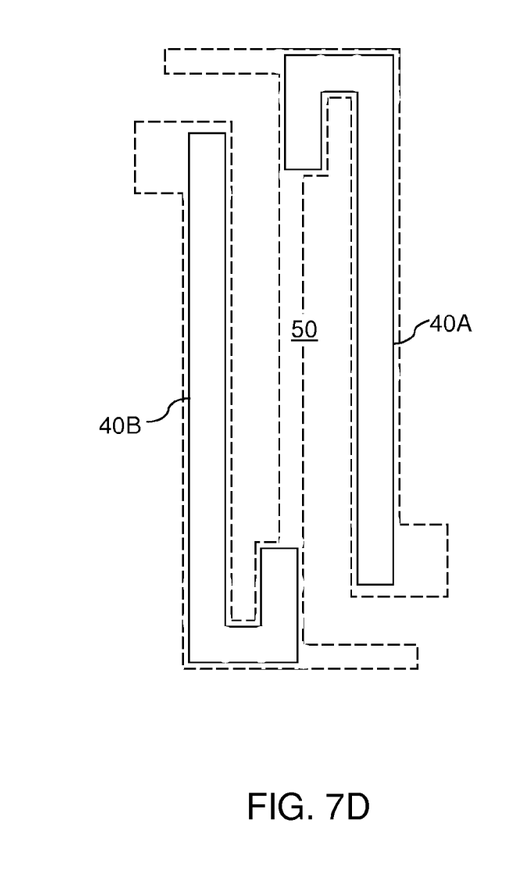
FIG. 7D is a horizontal cross-sectional view of an underlying via level layer.
Figure 7E:
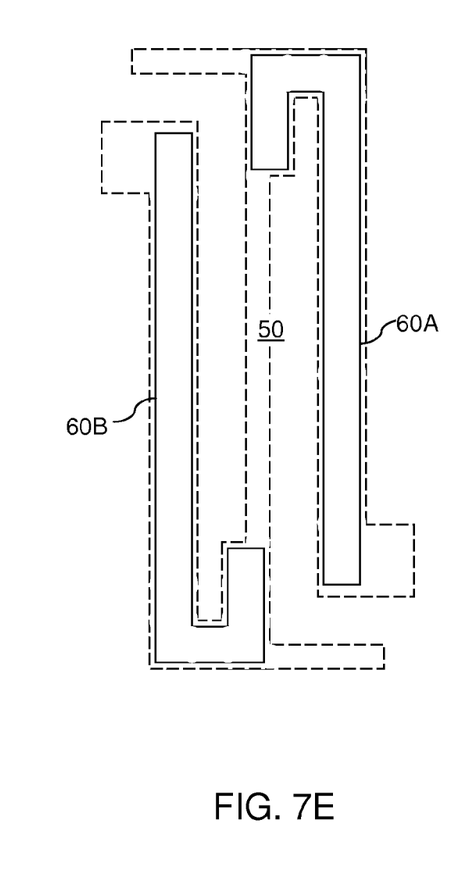
FIG. 7E is a horizontal cross-sectional view of an overlying via level layer.

The pair of upper level metal plates (70A, 70B) and the pair of upper level metal plates (70A, 70B) are conductively connected to the integral assembly 50 through metal via structures. Specifically, a first upper via level metal structure 60A is provided in the form of an array of discrete metal vias 60 embedded in the upper via level dielectric material layer 69 and vertically contacting the first upper level metal plate 70A. A second upper via level metal structure 60B is provided in the form of an array of discrete metal vias 60 embedded in the upper via level dielectric material layer 69 and vertically contacting the second upper level metal plate 70A. The first and second upper via level metal structures (60A, 60B) can be formed integrally with the pair of upper level metal plates (70A, 70B) if a dual damascene process is employed to simultaneously form the first and second upper via level metal structures (60A, 60B) and the pair of upper level metal plates (70A, 70B). Alternately, the pair of upper level metal plates (70A, 70B) can be formed after formation of the first and second upper via level metal structures (60A, 60B) with microscopic interfaces therebetween if single damascene processes are employed.

Likewise, a first lower via level metal structure 40A is provided in the form of an array of discrete metal vias 40 embedded in the lower via level dielectric material layer 49 and vertically contacting the first lower level metal plate 30A. A second lower via level metal structure 40B is provided in the form of an array of discrete metal vias 40 embedded in the lower via level dielectric material layer 49 and vertically contacting the second lower level metal plate 30A. The first and second lower via level metal structures (40A, 40B) can be formed integrally with the integral assembly 50 if a dual damascene process is employed to simultaneously form the first and second lower via level metal structures (40A, 40B) and the integral assembly 50. Alternately, the integral assembly 50 can be formed after formation of the first and second lower via level metal structures (40A, 40B) with microscopic interfaces therebetween if single damascene processes are employed.

The eFuse 100 of the second embodiment can be programmed in the same manner as the eFuse 100 of the first embodiment. During programming, electrical current passes through the programming transistor 201, a first set of metal interconnect structures embedded within the at least one underlying dielectric material layer 19, a first metal plate overlying or underlying the first metal line portion 54, a first via level metal structure vertically contacting the first metal plate and the first metal line portion 54, the integral assembly 50, a second via level metal structure vertically contacting second metal line portion 56, and a second metal plate overlying or underlying the second metal line portion 56 and vertically contacting the second via level metal structure.

In one embodiment, the first metal plate is the first lower level metal plate 30A, the first via level metal structure is the first lower via level metal structure 40A, the second via level metal structure is the second upper via level metal structure 60B, and the second metal plate is the second upper level metal plate 70B.

In another embodiment, the first metal plate is the first upper level metal plate 70A, the first via level metal structure is the first upper via level metal structure 60A, the second via level metal structure is the second lower via level metal structure 40B, and the second metal plate is the second lower level metal plate 30B.

In yet another embodiment, the first metal plate is the first lower level metal plate 30A, the first via level metal structure is the first lower via level metal structure 40A, the second via level metal structure is the second lower via level metal structure 40B, and the second metal plate is the second lower level metal plate 30B.

In still another embodiment, the first metal plate is the first upper level metal plate 70A, the first via level metal structure is the first upper via level metal structure 60A, the second via level metal structure is the second upper via level metal structure 60B, and the second metal plate is the second upper level metal plate 70B.

The pair of upper level metal plates (70A, 70B) and the pair of lower level metal plates (30A, 30B) help confine the heat generated during the programming within the vertical levels of the lower via level dielectric material layer 49, the eFuse level dielectric material layer 59, and the upper via level dielectric material layer 69. Further, the pair of upper level metal plates (70A, 70B) and the pair of lower level metal plates (30A, 30B) help prevent debris from the metal strip 51 generated during the programming from traveling outside the eFuse 100. In addition, the pair of upper level metal plates (70A, 70B) and the pair of lower level metal plates (30A, 30B) reduce diffusion of metal from the metal strip 51 after programming.

While embodiments described above include both the pair of upper level metal plates (70A, 70B) and the pair of lower level metal plates (30A, 30B), other embodiments can employ less than four metal plates (70A, 70B, 30A, 30B). For example, only three metal plates or two metal plates can be employed provided the metal plates provide a conductive path for electricity through the eFuse 100.

Referring to FIGS. 7A-7E, a variation of the second exemplary eFuse structure according to the second embodiment of the present disclosure can substitute each or any of the first upper via level metal structure 60A, the second upper via level metal structure 60B, the first lower via level metal structure 40A, and the second lower via level metal structure 40B with a via level metal structure of unitary construction (i.e., in a single piece) having a constant width along a lengthwise direction, and extending along a lengthwise direction of the first metal line portion 54 or a lengthwise direction of the second metal line portion 56. Thus, one or more of the first upper via level metal structure 60A, the second upper via level metal structure 60B, the first lower via level metal structure 40A, and the second lower via level metal structure 40B is a via level structure having a shape of a metal line.

The via level metal structures (60A, 60B, 40A, 40B) of unitary construction help confine the heat generated during the programming within the vertical levels of the lower via level dielectric material layer 49, the eFuse level dielectric material layer 59, and the upper via level dielectric material layer 69. Further, the via level metal structures (60A, 60B, 40A, 40B) of unitary construction help prevent debris from the metal strip 51 generated during the programming from traveling outside the eFuse 100. In addition, the via level metal structures (60A, 60B, 40A, 40B) of unitary construction reduce diffusion of metal from the metal strip 51 after programming.

Figure 8:
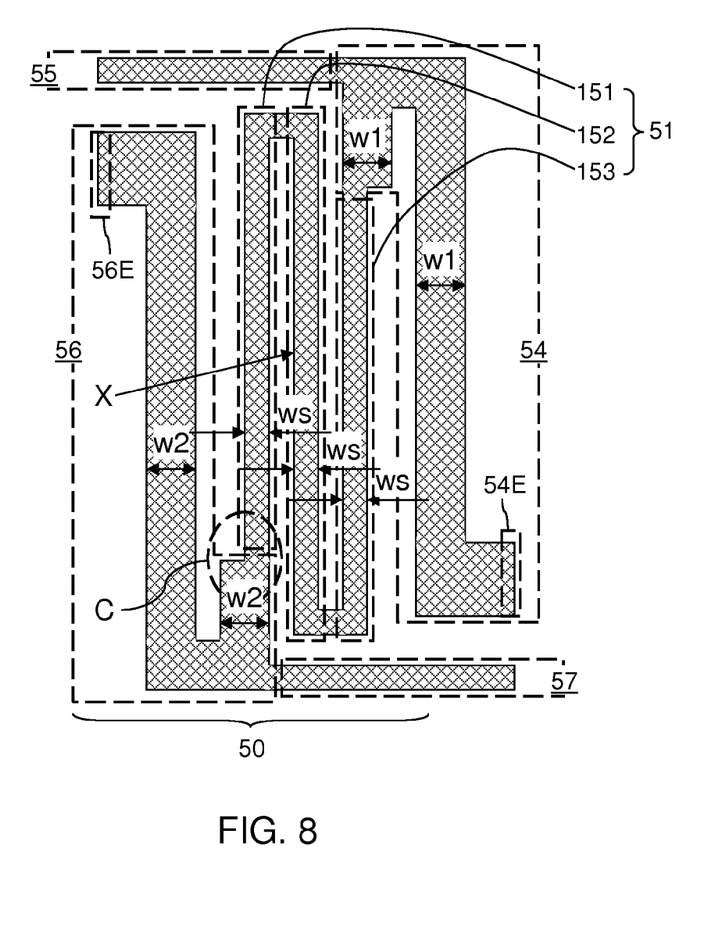
FIG. 8 is a horizontal cross-sectional view of a third exemplary eFuse structure according to a third embodiment of the present disclosure.
Figure 9A:
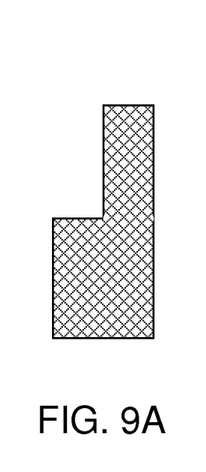
FIGS. 9A-9E illustrate various configurations at the junction between a metal strip and a wide metal line portion.
Figure 9B:
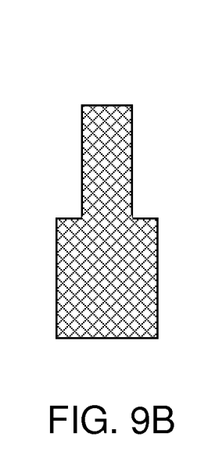
Figure 9C:
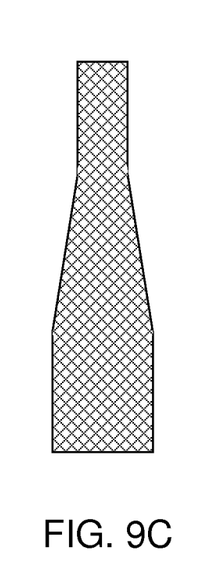
Figure 9D:
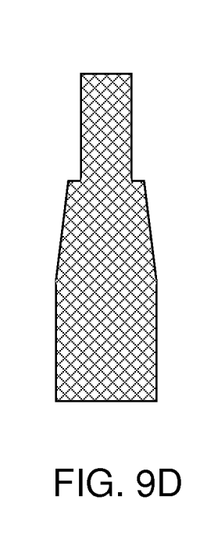
Figure 9E:
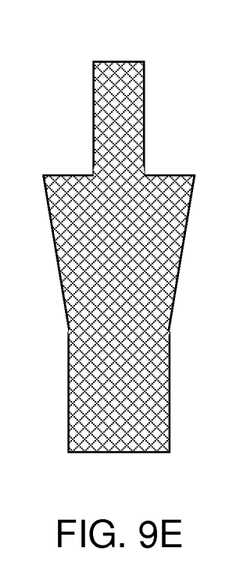

Referring to FIG. 8, a third exemplary eFuse structure according to a third embodiment of the present disclosure can be derived from any of the structures of the first and second embodiments. Specifically, the metal strip 51 of the third embodiment includes a plurality of rectangular parallelepipeds each having a strip width ws. For example, the metal strip 51 can be a structure of unitary construction in which a first end-side rectangular parallelepiped 151, a center rectangular parallelepiped 152, and a second end-side rectangular parallelepiped 153 are connected in a maze pattern with short interconnecting rectangular parallelepipeds therebetween. The plurality of rectangular parallelepipeds (151, 152, 153) are connected in a single conductive path between the first metal line portion 54 and the second metal line portion 56.

In one embodiment, rectangular parallelepipeds the plurality of rectangular parallelepipeds (151, 152, 153) are parallel among one another. Further, at least one, i.e, one or more, of the at least one rectangular parallelepiped (151, 152, 152) can have a length that is at least five times the strip width ws. For example, the center rectangular parallelepiped 152 can have a length that is at least five times the strip width ws.

The connection region between the metal strip 51 and each of the first metal line portion 54 and the second metal line portion 56 can have a suitable shape as need to make the temperature gradient in the metal strip 51 gradual and/or to avoid electromigration failure at the junction between the metal strip 51 and each of the first metal line portion 54 and the second metal line portion 56. Referring to FIGS. 9A-9E, the configuration at the junction between the metal strip 51 and each of the first metal line portion 54 and the second metal line portion 56, which are "wide" metal line portions having a width greater than the strip width ws, can be optimized as needed.

In each of the exemplary configurations illustrated above, the length of the metal strip 51 and/or each of the first metal line portion 54 and the second metal line portion 56 and/or any additional metal lines and metal vias can be selected so as to provide a hot zone, i.e., a heated zone, having a gradual temperature gradient profile within the metal strip 51 that is conducive to slow electromigration. In one embodiment, the length of the hot zone can be longer than the Blech length of the metal strip 51 so there is a high probability that the programming is caused electromigration, but not by a thermal blow. Further, the protective structures made of metal lines and/or metal vias around the hot zone, and particularly around the metal strip 51, prevent debris and/or cracking from propagating outside of the eFuse structure during programming, and also prevents metal from diffusing outside the "confined" region during product operation.

While the disclosure has been described in terms of specific embodiments, it is evident in view of the foregoing description that numerous alternatives, modifications and variations will be apparent to those skilled in the art. For example, though the present disclosure is described with exemplary structures including a field effect transistor and an antifuse structure, the present disclosure may be practiced without any field effect transistor. Accordingly, the disclosure is intended to encompass all such alternatives, modifications and variations which fall within the scope and spirit of the disclosure and the following claims.

What is claimed is:

1. A structure comprising an electrically programmable fuse (eFuse), said eFuse comprising an integral assembly of a metal strip, a first metal line portion, and a second metal line portion without an interface thereamongst, wherein said integral assembly is embedded in a wiring level dielectric material layer, a first end of said metal strip is adjoined to said first metal line portion, a second end of said metal strip is adjoined to said second metal line portion, said first metal line portion and said second metal line portion have widths that are greater than a strip width of said metal strip, and said first metal line portion and said second metal line portion collectively block all line-of-sight horizontal directions from an entirety of sidewalls of said metal strip, wherein sidewalls of said metal strip are parallel to a first sidewall of said first metal line portion and a second sidewall of said second metal line portion, and an entirety of a first volume between one of said sidewalls of said metal strip and said first sidewall consists of a first portion of said wiring level dielectric material layer, and an entirety of a second volume between another of said sidewalls of said metal strip and said second sidewall consists of a second portion of said wiring level dielectric layer.

2. The structure of claim 1, wherein said metal strip includes a single rectangular parallelepiped that has said strip width and extends between said first metal line portion and said second metal line portion.

3. The structure of claim 1, wherein said metal strip includes a plurality of rectangular parallelepipeds each having said strip width and connected with short interconnecting rectangular parallelepipeds thereamongst in a single conductive path in a maze pattern between said first metal line portion and said second metal line portion.

4. The structure of claim 3, wherein each rectangular parallelepiped among said plurality of rectangular parallelepipeds is parallel among one another.

5. The structure of claim 1, wherein at least one of said at least one rectangular parallelepiped has a length that is at least five times said strip width.

6. The structure of claim 1, further comprising:
at least one upper level metal plate embedded in an upper wiring level dielectric material layer located above said wiring level dielectric material layer, said at least one upper level metal plate overlying at least a portion of said integral assembly; and
at least one lower level metal plate embedded in a lower wiring level dielectric material layer located below said wiring level dielectric material layer, said at least one lower level metal plate underlying at least a portion of said integral assembly.

7. The structure of claim 6, wherein said at least one upper level metal plate and said at least one lower level metal plate are electrically isolated from said integral assembly.

8. The structure of claim 6, wherein said at least one upper level metal plate and said at least one lower level metal plate are conductively connected to said integral assembly through via level metal structures.

9. The structure of claim 6, wherein said at least one upper level metal plate overlies an entirety of said metal strip, and said at least one lower level metal plate underlies an entirety of said metal strip.

10. The structure of claim 6, wherein each of said at least one upper level metal plate and said at least one lower level metal plate include a pair of metal plates, wherein a first metal plate of said pair of metal plates overlies or underlies said first metal line portion, and a second metal plate of said pair of metal plates overlies or underlies said second metal line portion.

11. The structure of claim 10, further comprising:
a first via level metal structure vertically contacting said first metal plate, having a constant width along a lengthwise direction, and extending along a lengthwise direction of said first metal line portion; and
a second via level metal structure vertically contacting said second metal plate, having a constant width along a lengthwise direction, and extending along a lengthwise direction of said second metal line portion.

12. The structure of claim 1, wherein said eFuse and said wiring level dielectric material layer are located on a semiconductor substrate, and said structure further comprises a programming transistor located on said semiconductor substrate and conductively connected to one of said first metal line portion and said second metal line portion through a set of metal interconnect structures including at least one conductive metal via.

13. The structure of claim 12, wherein said set of metal interconnect structures comprises:
a first metal line structure embedded in said wiring level dielectric material layer and laterally contacting said first metal line portion and vertically contacting a first metal via; and
a second metal line structure embedded in said wiring level dielectric material layer and laterally contacting said second metal line portion and vertically contacting a second metal via, wherein said first metal line structure and said second metal line structure are of integral construction with said integral assembly.

14. The structure of claim 12, further comprising:
a first via level metal structure vertically contacting said first metal line portion and conductively connected to said programming transistor without passing through said integral assembly; and
a second via level metal structure vertically contacting said second metal line portion and conductively connected to said programming transistor through said integral assembly.

15. The structure of claim 12, further comprising a semiconductor device located on said semiconductor substrate and a metal wiring structure embedded in said wiring level dielectric material layer and conductively connected to said semiconductor device.

16. A method of programming an electrically programmable fuse (eFuse), said method comprising:
forming an eFuse and a programming transistor conductive connected to said eFuse on a semiconductor substrate, said eFuse comprising an integral assembly of a metal strip, a first metal line portion, and a second metal line portion without an interface thereamongst, wherein said integral assembly is embedded in a wiring level dielectric material layer, a first end of said metal strip is adjoined to said first metal line portion, a second end of said metal strip is adjoined to said second metal line portion, said first metal line portion and said second metal line portion have widths that are greater than a strip width of said metal strip, and said first metal line portion and said second metal line portion collectively block all line-of-sight horizontal directions from an entirety of sidewalls of said metal strip, wherein sidewalls of said metal strip are parallel to a first sidewall of said first metal line portion and a second sidewall of said second metal line portion, and an entirety of a first volume between one of said sidewalls of said metal strip and said first sidewall consists of a first portion of said wiring level dielectric material layer, and an entirety of a second volume between another of said sidewalls of said metal strip and said second sidewall consists of a second portion of said wiring level dielectric layer; and
turning on said programming transistor during programming of said eFuse, wherein electrical current passes through said programming transistor and said eFuse to cause electromigration of metal at a center portion of said eFuse and to form a void therein.

17. The method of claim 16, wherein said electrical current passes through said programming transistor, a first set of metal interconnect structures including a first metal via, a first metal line structure embedded in said wiring level dielectric material layer and laterally contacting said first metal line portion and vertically contacting said first metal via, said integral assembly, a second metal line structure embedded in said wiring level dielectric material layer and laterally contacting said second metal line portion, a second set of metal interconnect structures including a second metal via vertically contacting said second metal line structure, wherein said first metal line structure and said second metal line structure are of integral construction with said integral assembly.

18. The method of claim 16, wherein said electrical current passes through said programming transistor, a first set of metal interconnect structures, a first metal plate overlying or underlying said first metal line portion, a first via level metal structure vertically contacting said first metal plate and said first metal line portion, said integral assembly, a second via level metal structure vertically contacting second metal line portion, and a second metal plate overlying or underlying said second metal line portion and vertically contacting said second via level metal structure.

19. The method of claim 16, wherein a temperature gradient is formed within and around said metal strip during said programming of said eFuse, wherein a center portion of said metal strip is heated to a temperature higher than any other location within said eFuse, and said temperature gradient is along a lengthwise direction of said metal strip.

20. The method of claim 16, wherein said metal strip is a plurality of rectangular parallelepipeds connected with short interconnecting rectangular parallelepipeds thereamongst in a single conductive path in a maze pattern between said first metal line portion and said second metal line portion.

* * * * *